(12) United States Patent  
Mazumder et al.

(10) Patent No.: US 11,217,295 B2  
(45) Date of Patent: Jan. 4, 2022

(54) APPARATUSES AND METHODS FOR ADDRESS DETECTION

(71) Applicant: MICRON TECHNOLOGY, INC., Boise, ID (US)

(72) Inventors: Kallol Mazumder, Plano, TX (US); Jason M. Brown, Allen, TX (US); Derek R. May, Fairview, TX (US); Jeffrey E. Koelling, Fairview, TX (US); Roger D. Norwood, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 175 days.

(21) Appl. No.: 16/600,355

(22) Filed: Oct. 11, 2019

(65) Prior Publication Data

US 2020/0042423 A1    Feb. 6, 2020

Related U.S. Application Data

(62) Division of application No. 14/168,749, filed on Jan. 30, 2014, now Pat. No. 10,534,686.

(51) Int. Cl.
| | | |
|---|---|---|
| *G11C 11/406* | (2006.01) | |
| *G11C 11/408* | (2006.01) | |
| *G06F 11/34* | (2006.01) | |

(52) U.S. Cl.
CPC ........ *G11C 11/406* (2013.01); *G06F 11/3471* (2013.01); *G11C 11/408* (2013.01); *G11C 11/40611* (2013.01)

(58) Field of Classification Search
None
See application file for complete search history.

(56) References Cited

U.S. PATENT DOCUMENTS

| | | |
|---|---|---|
| 6,073,225 A | 6/2000 | James et al. |
| 2009/0016134 A1 | 1/2009 | Fukuda |
| 2010/0034024 A1* | 2/2010 | Mochizuki ........... G11C 16/105 365/185.18 |
| 2010/0088459 A1 | 4/2010 | Arya et al. |
| 2011/0264843 A1 | 10/2011 | Haines et al. |
| 2012/0137081 A1 | 5/2012 | Shea |
| 2013/0159670 A1 | 6/2013 | Noyes et al. |
| 2013/0205080 A1 | 8/2013 | Felton et al. |

(Continued)

*Primary Examiner* — Charles J Choi
(74) *Attorney, Agent, or Firm* — Dorsey & Whitney LLP

(57) ABSTRACT

Apparatuses and methods for address detection are disclosed herein. An example apparatus it an address filter and an address tracking circuit. The address filter may be configured to receive a first address and to determine whether the first address matches an address of a plurality of addresses associated with the address filter. The address tracking circuit may be coupled to the address filter and configured to store the first address responsive to a determination that the first address matches an address of the plurality of addresses associated with the address filter. The address tracking circuit may further be configured to receive a second address and to change a count associated with the first address based on the second address matching the first address. The address tracking circuit may be configured to selectively provide the first address responsive to the count.

20 Claims, 7 Drawing Sheets

(56) References Cited

U.S. PATENT DOCUMENTS

| | | | |
|---|---|---|---|
| 2014/0108716 A1* | 4/2014 | Bae | G11C 11/4076 |
| | | | 711/105 |
| 2014/0258603 A1 | 9/2014 | Karamcheti et al. | |
| 2014/0269134 A1* | 9/2014 | Kim | G11C 11/40611 |
| | | | 365/222 |
| 2015/0058549 A1 | 2/2015 | Jeffrey et al. | |
| 2015/0100753 A1 | 4/2015 | Shen et al. | |
| 2015/0213872 A1 | 7/2015 | Mazumder et al. | |
| 2016/0042782 A1 | 2/2016 | Narui et al. | |

* cited by examiner

APPARATUSES AND METHODS FOR ADDRESS DETECTION

CROSS-REFERENCE TO PRIOR APPLICATIONS

This application is a divisional of U.S. patent application Ser. No. 14/168,749, filed Jan. 30, 2014 and issued as U.S. Pat. No. 10,534,686 on Jan. 14, 2020. The aforementioned application, and issued patent, is incorporated herein by reference, in its entirety, for any purpose.

BACKGROUND

In current memory systems, data stored in volatile memories (e.g., DRAM) must be periodically refreshed to compensate for inherent leakage of capacitors in memory cells. Conventionally, refreshing includes, for example, sensing, data out of each row of memory and subsequently writing the data back to the same respective row. As a result, the original charge level in each memory cell is restored and data preserved.

While many approaches for implementing memory refreshes to compensate for leakage are well known in the art, these approaches have struggled when applied to the increasingly demanding operating speeds and applications of memories today. For example, data stored in rows of memory physically adjacent a repeatedly accessed row may degrade more quickly than data stored in other rows. That is, due to coupling effects, cell to cell leakage may increase, and accessing a row a relatively high number (e.g., 100,000) of times during a particular period of time (e.g., less than 32 ms) may degrade data stored in rows physically adjacent the accessed row. While some approaches have strived to ensure no row suffers from "row hammering" effects by tracking the number of times every row of a memory is accessed, maintaining counts in this manner is cumbersome and requires a relatively large footprint.

DETAILED DESCRIPTION

Apparatuses and methods for address detection are disclosed herein. In accordance with one or more embodiments described herein, a row address may be detected based on a frequency at which the row address is provided and/or may be detected randomly. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
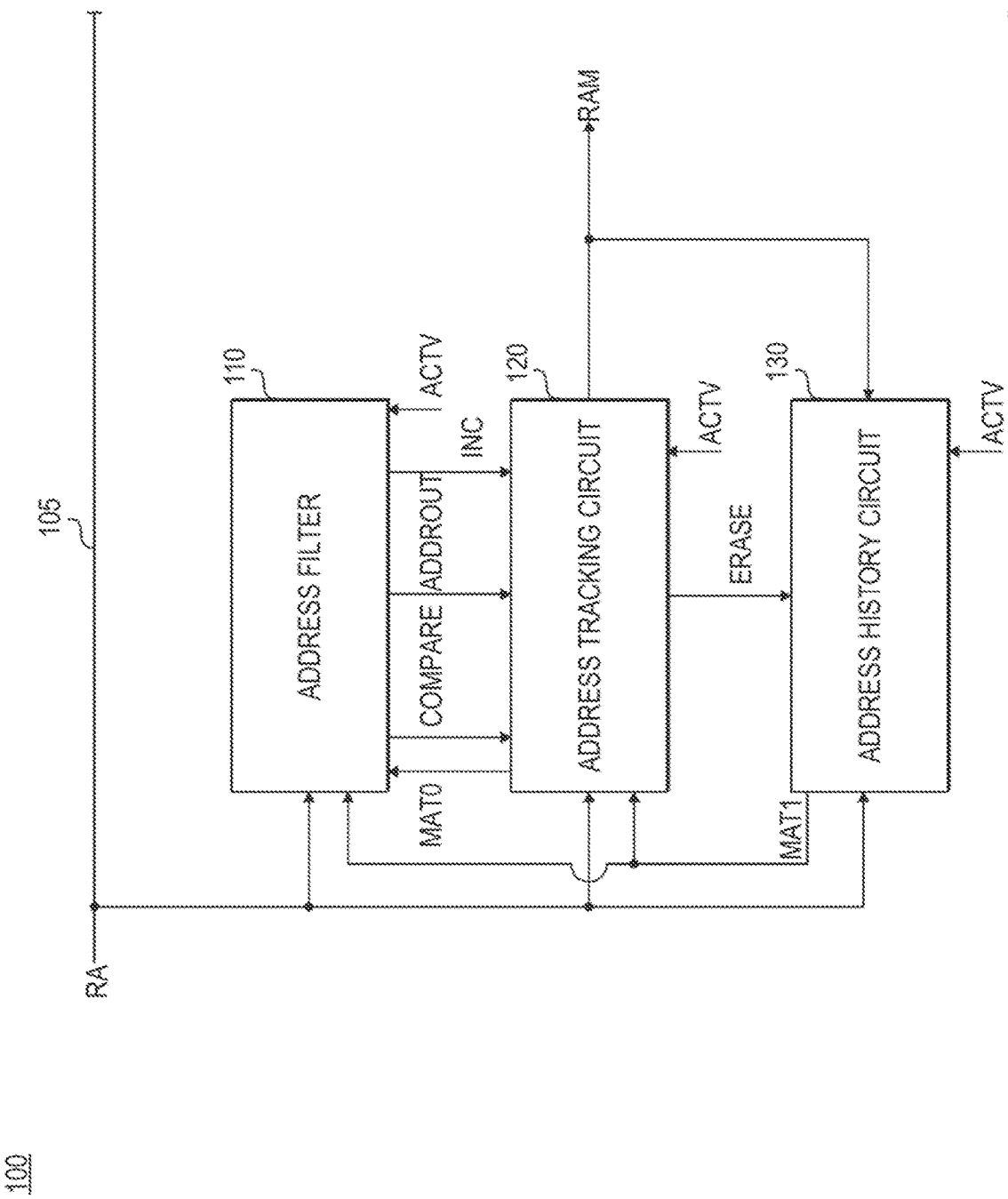
FIG. 1 is a block diagram of an apparatus according to a embodiment of the present invention.

FIG. 1 is a block diagram of an apparatus that includes an address detection circuit 100 according to an embodiment of the present invention. The address detection circuit 100 may include an address filter 110, an address tracking circuit 120, and an address history circuit 130.

The address filter 110 may be configured to selectively store and selectively provide addresses. In some embodiments, the addresses are associated with a group of memory, for example, rows of memory. However, in other embodiments, the addresses may be associated with other groups of memory. Thus, the present invention is not limited to any particular memory grouping. The address filter 110 may be coupled to the address tracking circuit 120 and the address history circuit 130. In an embodiment where the addresses are associated with rows of memory, the address filter 110 may be configured to receive a row address RA from the row address bus 105, for instance, responsive to an activate command ACTV. The address filter 110 may selectively store the row address RA. The address filter 110 may determine whether the row address RA matches any row addresses associated with (e.g. stored in) the address tracking circuit 120 and/or the address history circuit 130. Additionally or alternatively, the address filter 110 may determine whether the row address RA matches any row addresses associated with one or more other elements of the address detection circuit 100, such as a memory (not shown). If a match is found in either the address tracking circuit 120 or the address history circuit 130, the address filter 110 may ignore the row address RA. If the row address RA does not match a row address associated with the address tracking circuit 120 or the address history circuit 130, the address filter 110 may determine whether the row address RA matches any row address associated with (e.g. stored in) the address filter 110. If a match is found, the address filter 110 may provide the row address RA to the address tracking circuit 120 as the row address INC. If a match is not found, the address filter 110 may store the row address RA.

In at least one embodiment, the address filter 110 may receive a control signal MAT0 indicating whether the row address RA is stored in the address tracking, circuit 120 and may further receive a control signal MAT1 indicating whether the row address RA is stored in the address history circuit 130. In other embodiments, the address filter 110 may track row addresses stored in the address tracking circuit 120 and the address history circuit 130 and accordingly may not need to receive both the MAT0, MAT1 control signals.

The address filter 110 may further be configured to provide COMPARE and ADDROUT control signals and may, for instance, assert the COMPARE and ADDROUT control signals during each refresh interval. As described herein, a refresh interval may comprise a period of time in which a particular number (e.g., 256) of refresh operations are performed. In some examples, the address filter 110 may provide the COMPARE and ADDROUT control signals to the address tracking circuit 120, and may assert at least one of the COMPARE and ADDROUT control signals responsive to (e.g. on or during) the last refresh operation of a refresh interval. In other examples, the address filter 110 may assert the COMPARE and ADDROUT control signals responsive to different refresh operations of a refresh interval. In some instances, the address filter 110 may be configured to track the number of refresh operations performed. In this manner, the address filter 110 may determine when to assert the COMPARE and ADDROUT control signals. The address filter 110 may, for instance, track refresh operations based on a state (e.g., count) of a memory refresh counter (not shown). As will be described, in response to asserted COMPARE and ADDROUT control signals to the address tracking circuit 120, the address tracking circuit 120 may selectively identify and provide an address associated with a row accessed an extremum (e.g. a highest) number of times over a period, respectively.

The address tracking circuit 120 may be configured to selectively count a number of times one or more row addresses are provided on the row address bus 105. The address tracking circuit 120 may be configured to store each row address INC provided by the address filter 110. The address tracking circuit 120 may further receive a row address RA from the row address bus 105 in response to an activate command ACTV. Once an address RA is received, the address tracking circuit 120 may determine whether the row address RA matches any row addresses associated with (e.g. stored in) the address tracking circuit 120, and indicate whether a match exists using the MAT0 control signal.

The address tracking circuit 120 may further be coupled to the address history circuit 130 and receive the MAT1 control signal indicating whether the row address RA matches a row address associated with (e.g. stored in) the address history circuit 130. If a match is not found in the address history circuit 130, but the row address RA matches a row address associated with the address tracking circuit 120, the address tracking circuit 120 may change (e.g. increment) a count associated with the stored row address, indicating that the stored row address has been provided on the row address bus 105 an additional time.

In some examples, the address tracking circuit 120 may receive the control signals COMPARE and ADDROUT from the address filter 110. Responsive to the COMPARE control signal being asserted, the address tracking circuit 120 may select a stored address associated with a highest count. Responsive to the ADDROUT control signal being asserted, the address tracking circuit 120 may selectively provide the selected row address as the row address REFADDR. By way of example, the address tracking circuit 120 may determine if the highest count satisfies a count threshold. If the threshold is satisfied, the address tracking circuit 120 may provide the selected row address as the row address REFADDR. If the threshold is not satisfied, the row tracking circuit 120 may assert the ERASE control signal.

The address history circuit 130 may be configured to store each row address REFADDR provided by the address tracking circuit 120. In response to an activate command ACTV, the address history circuit 130 may receive a row address RA from the row address bus 105 and provide the MAT1 control signal to indicate whether the row address RA matches any row addresses associated with (e.g. stored in) the address history circuit 130.

The address history circuit 130 may further receive the ERASE control signal from the address tracking circuit 120, and in response selectively erase row addresses stored in the address history circuit 130. If the number of stored addresses stored in the address history circuit 130 does not exceed a threshold, the address history circuit 130 may erase the oldest row address stored in the address history circuit 130. If the number of stored addresses stored in the address history circuit 130 does exceed the threshold, the address history circuit 130 may iteratively erase the oldest row address stored in the address history circuit 130 until the number of row addresses no longer exceeds the threshold. By deleting addresses in this manner, the address history circuit 130 may ensure that addresses being accessed a relatively high number of times over a particular amount of time may be refreshed as necessary. That is, by deleting oldest addresses and maintaining a number of stored addresses under a threshold, stored addresses accessed a relatively high number of times may be erased from the address history circuit 130 such that the addresses may be refreshed prior to row hammering effects resulting.

Thus in some examples, the apparatus 100 operates to identify one or more addresses associated with rows having been accessed a particular number of times within a particular amount of time. Identified addresses may be selectively provided as described herein. Addresses may be tracked both within each refresh interval and across multiple refresh intervals, and addresses provided in this manner may be subsequently used in a refresh operation to refresh rows adjacent the row associated with the address, thereby mitigating potential row hammering effects.

Each of the address filter 110, address tracking circuit 120, and address history circuit 130 may be configured to store any number of addresses and further may store a same number of addresses or different numbers of addresses. The number of addresses that may be stored may be referred to as a "depth." In some examples, the number of addresses stored in each of the address filter 110, address tracking circuit 120, and address history circuit 130 may be based on a particular threshold frequency of a row address RA. For example, it may be desirable to identify addresses RA provided at least a particular number of times over a particular period of time (e.g., at or greater than a particular frequency). Generally, the lower the frequency, the greater the depths of one or more of the address filter 110, address tracking circuit 120, and address history circuit 130. By way of example, the depth of the address filter 110 may determine a number of addresses that may be simultaneously considered to identify an address match. The depth of the address tracking circuit 120 may determine a number of addresses that may be simultaneously counted. The depth of the address history circuit may determine a number of unique addresses that may be detected over reach refresh interval.

In an example operation of the address detection circuit 100, a row address RA may be provided on the row address bus 105 and in response to an activate command ACTV, the row address RA may be received by each of the address filter 110, the address tracking circuit 120, and the address history circuit 130. The address tracking circuit 120 may provide the MAT0 control signal indicating whether the row address RA matches a row address stored in the address tracking circuit 120, and the address history circuit 130 may provide the MAT1 control signal indicating whether the row address RA matches a row address stored in the address history circuit 130. The address tracking circuit 120 may further change (e.g. increment) a count associated with a stored row address if the stored row address matches the row address RA and no match is found in the address history circuit 130.

If the row address RA does not match row addresses associated with the address tracking circuit 120 or the address history circuit 130, the address filter 110 may determine whether the row address RA matches any row addresses associated with the address filter 110. If a match is found in the address filter 110, the row address RA may be provided to the address tracking circuit 120 as the row address INC. If a match is not found, the row address RA may be stored in the address filter 110.

The address filter 110 may assert the COMPARE control signal to the address tracking circuit 120 responsive to the address filter 110 determining that a particular number of refresh operations have been performed (e.g., as indicated by a memory refresh counter). The address tracking circuit 120 may select the stored row address associated with a highest count. The address filter 110 may further assert the ADDROUT control signal to the address tracking circuit 120 and the address tracking circuit 120 may determine whether the highest count satisfies a threshold. If so, the address tracking circuit 120 may provide the identified address as the row address REFADDR. The address history circuit 130 may receive and store the row address REFADDR. If the count does not satisfy the threshold, the address tracking circuit 120 may provide the ERASE control signal, and in response the address history circuit 130 may erase one or more stored row addresses as described.

Operation may iteratively continue in this manner for each refresh interval. As described, the COMPARE and ADDROUT control signals may be asserted during a same refresh operation or during different refresh operations. In this manner, row addresses RA provided on the row address bus 105 at a relatively high frequency may be detected and/or provided as row addresses REFADDR. As described, row addresses provided in this manner may be used to mitigate row hammering effects, though row addresses provided in this manner may be provided for other uses as well.

Figure 2:
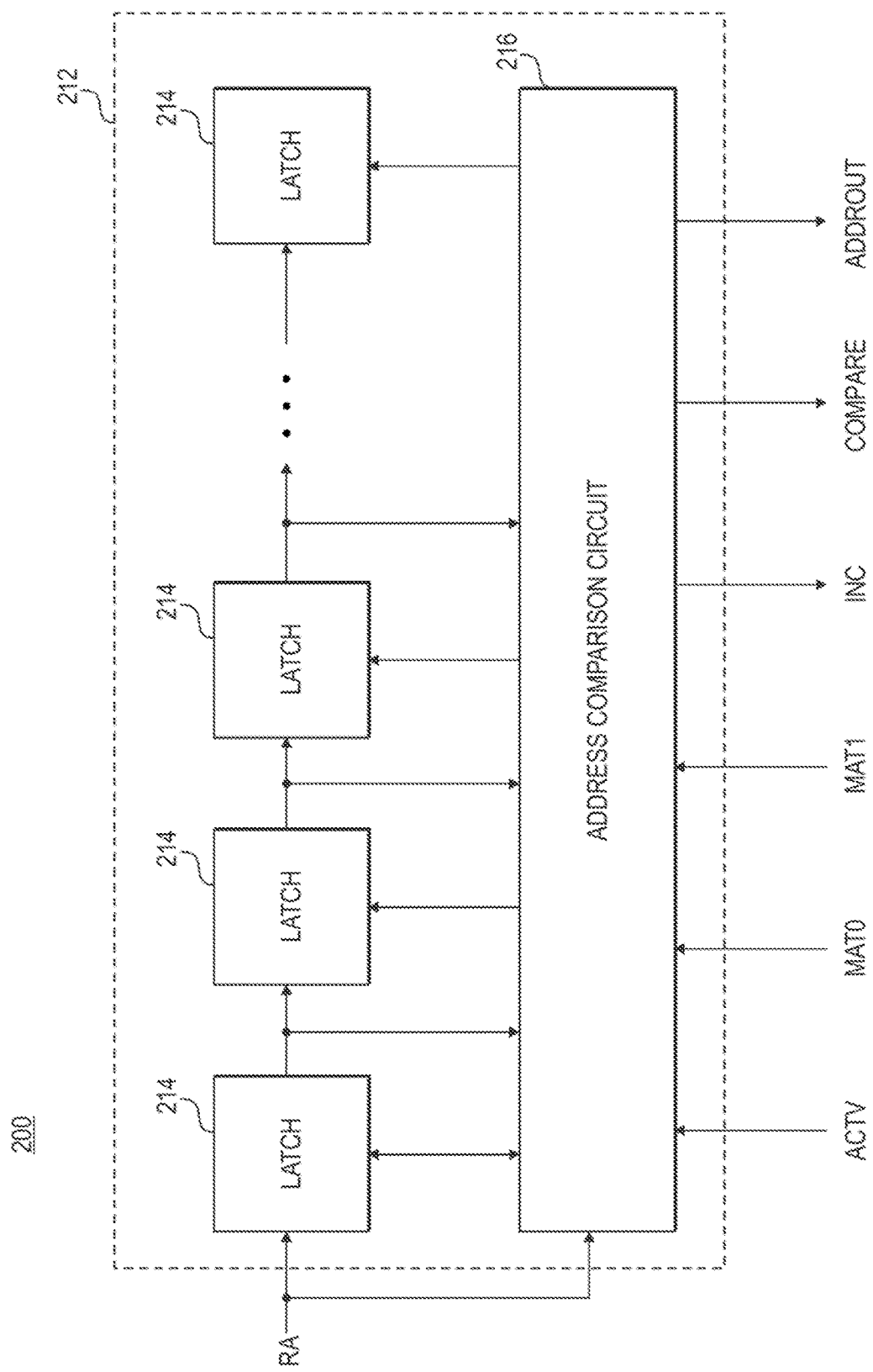
FIG. 2 is a block diagram of an address filter according to an embodiment of the present invention.

FIG. 2 is a block diagram of an address filter 200 according to an embodiment of the present invention. The address filter 200 may be used to implement the address filter 110 of FIG. 1. The address filter 200 may include a FIFO buffer 212 and an address comparison circuit 216.

The address comparison circuit 216 may be included in the FIFO buffer 212 and configured to receive the row address RA, for instance, in response to an activate command ACTV. The address comparison circuit 216 may further receive the control signals MAT0 and MAT1 from the address tracking circuit 120 and address history circuit 130 of FIG. 1, respectively. Based on the control signals MAT0, MAT1, the address comparison circuit 216 may determine whether the row address RA matches a row address stored in the address tracking circuit 120 or the address history circuit 130. If a match is not found in the address tracking circuit 120 or the address history circuit 130, the address comparison circuit 216 may determine whether the row address RA matches any row addresses stored in the FIFO buffer 212. If a match is found in the FIFO buffer 212, the address comparison circuit 216 may provide the row address RA as the row address INC. If a match is not found in the FIFO buffer 212, the address comparison circuit 216 may store the row address RA in the FIFO buffer 212.

As illustrated, the FIFO buffer 212 may comprise a plurality of series coupled latches 214. An output of each of the latches 214 may be coupled to the address comparison circuit 216. In this manner, the address comparison circuit 216 may receive each of the row addresses stored in the FIFO buffer 212 for comparison with row addresses RA. Moreover, the address comparison circuit 216 may be configured to clock each of the plurality of latches 214 such that row addresses stored in the FIFO buffer 212 may be serially propagated through the plurality of latches 214. In some examples, the address comparison circuit 216 may be configured to selectively clock each of the plurality of latches. For example, the address comparison circuit 216 may clock each of the plurality of latches 214 when storing a row address RA. While the FIFO buffer 212 is illustrated as including 4 latches 214, it will be appreciated that the FIFO buffer 212 may include any number of latches 214 (e.g., 16).

The address comparison circuit 216 may assert the COMPARE and ADDROUT control signals. As described, the address comparison circuit 216 may assert the control signals COMPARE and ADDROUT during a same refresh operation, or during different refresh operations. The address comparison circuit 216 may track refresh operations based on a count of a memory refresh counter.

Figure 3:
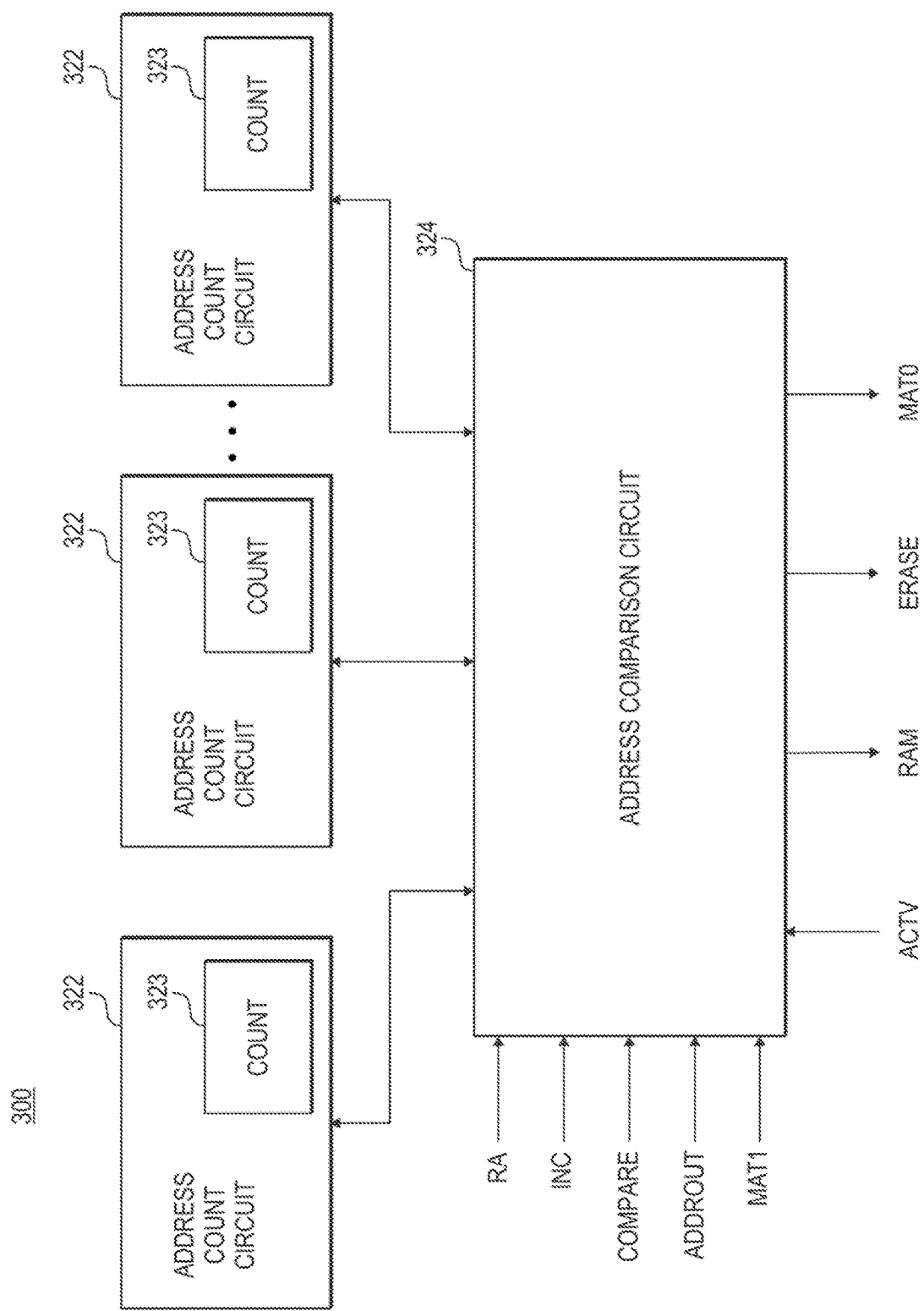
FIG. 3 is a block diagram of an address tracking circuit according to an embodiment of the present invention.

FIG. 3 is a block diagram of an address tracking circuit 300 according to an embodiment of the present invention. The address tracking circuit 300 may be used to implement the address tracking circuit 120 of FIG. 2. The address tracking circuit 300 may include a plurality of address count circuits 322 and an address comparison circuit 324.

Each of the address count circuits 322 may be coupled to the address comparison circuit 324 and configured to store a respective row address, and further may include a respective counter 323 configured to store, increment, and/or decrement a count associated with the stored row address.

The address comparison circuit 324 may be configured to receive row addresses INC and store each row address INC in an address count circuit 322. In some embodiments, the address comparison circuit 324 may store a row address INC in the address count circuit 322 having a counter 323 with a lowest count. By way of example, in response to receipt of a row address INC, the address comparison circuit 324 may determine whether any of the address count circuits 322 are available, e.g., whether any of the address count circuits has a counter 323 with a count of zero. If an address count circuit 322 is available, the address comparison circuit 324 may store the row address INC therein and set the count of the respective counter 323 to 1. If no address count circuit 322 is available, the address comparison circuit 324 may store the row address INC in the address count circuit 322 having a counter 323 with a lowest Count and set the count of the counter 323 to 1.

The address comparison circuit 324 may be configured to receive a row address RA in response to an activate command ACTV and determine whether the row address RA matches any of the row addresses stored in the address count circuits 322. The address comparison circuit 324 may provide the MAT0 control signal indicating whether a match exists. If a match is found, and the row address RA is not stored in the address history circuit 130 as indicated by the control signal MAT1, the address comparison circuit 324 may increment the counter 323 associated with the address count circuit 322 having the matched address.

The address comparison circuit 324 may further be configured to select the stored row address associated with a highest count. For example, responsive to the COMPARE control signal being asserted, the address comparison circuit 324 may determine which of the counters 323 has a highest count, and accordingly which stored row address is associated with the highest count.

The address comparison circuit 324 may further be configured to selectively provide the identified row address as the row address REFADDR. For example, in response to the control signal ADDROUT being asserted, the address comparison circuit 324 may provide the identified row address as the row address REFADDR if the count associated with the address satisfies a threshold. If the threshold is not satisfied (e.g., the associated count is too low), the address comparison circuit 324 may assert the ERASE control signal. Once an address has been provided as the row address REFADDR or the ERASE control signal has been asserted, the address comparison circuit 324 may set a value of the counter 323 having the identified count to 0, thereby causing the associated address count circuit 322 to become available.

An address filter, such as the address filter 110 of FIG. 1, has been described herein as providing the COMPARE and ADDROUT control signals. In some examples, however, an address filter 110 need not provide the COMPARE and ADDROUT control signals to the address comparison circuit 324. For example, in some embodiments, the address comparison circuit 324 may be configured to track refresh operations, and may select the address associated with the greatest count and/or selectively provide the selected address based on the magnitude of the count during each refresh operation. As described, in some instances, the address associated with the greatest count may be selected during a first refresh operation and an address may be selectively provided during a second refresh operation.

The address comparison circuit 324 has been described as determining highest and lowest counts, respectively. In some examples, the address comparison circuit 324 may include one or more comparators (not shown) to select highest and lowest counts.

In some embodiments, the address comparison circuit 324 may be configured to periodically adjust the count of each counter 323. By way of example, in response, to a particular number of activate commands ACTV, the address comparison circuit 324 may decrement the count of each counter 323 (e.g., by 1) and/or set the value of a counter 323 to 0 if the count is below a threshold. The address comparison circuit 324 may, for instance, be configured to adjust the count of each counter 323 after providing the ADDROUT control signal. As described, addresses identified by the address comparison circuit 324 may be used to mitigate row hammering effects. However, in some instances, rows may be accessed at a low enough rate where no row hammering effects result and accordingly, no extra refreshes are necessary. By adjusting the count as described herein, refreshes may be performed for only those rows that may require an additional refresh operation to mitigate row hammering effects.

Figure 4:
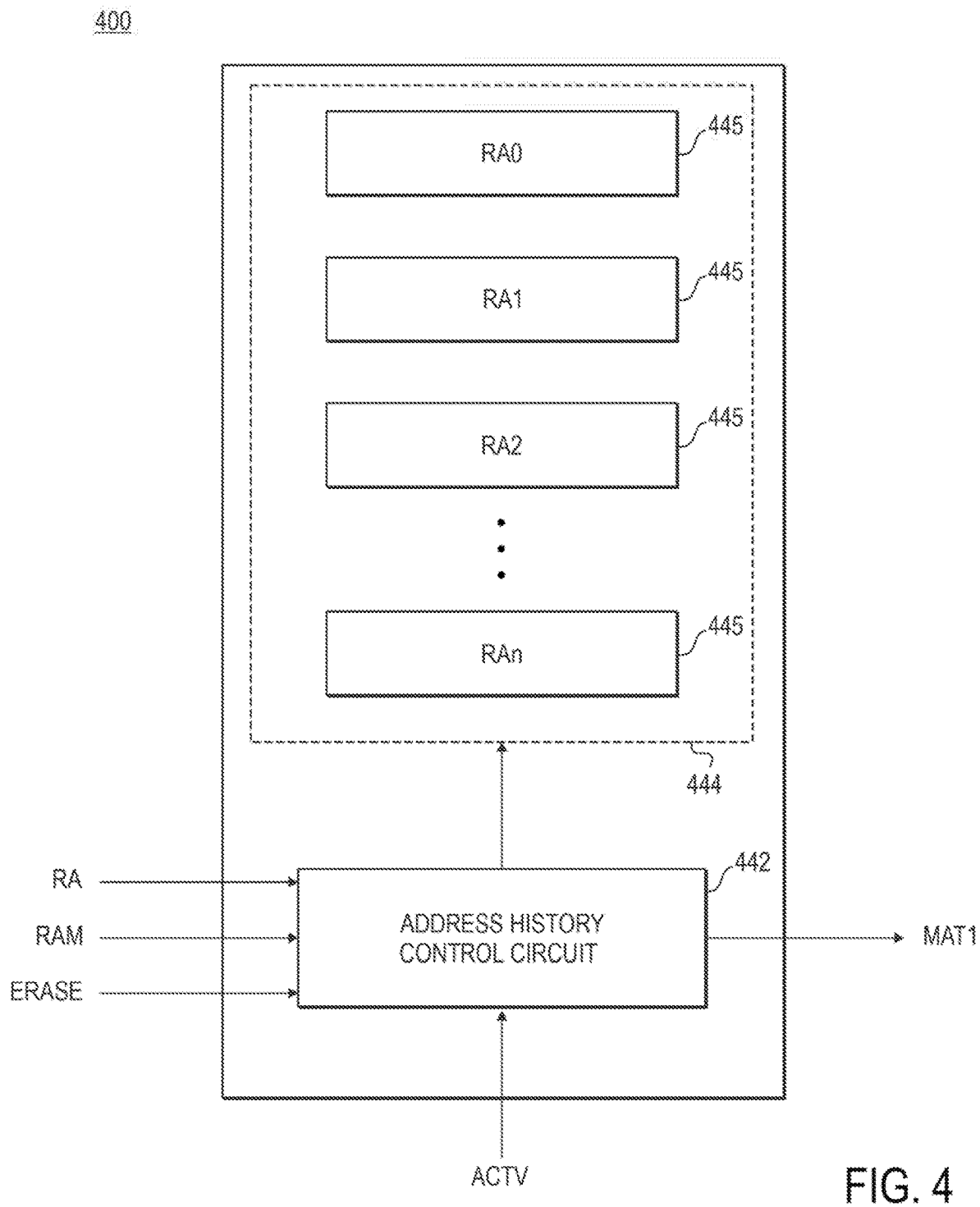
FIG. 4 is a block diagram of an address history circuit according to an embodiment of the present invention.

FIG. 4 is a block diagram of an address history circuit 400 according to an embodiment of the present invention. The address history circuit 400 may be used to implement the address history circuit 130 of FIG. 1. The address history circuit 400 may include an address history control circuit 442 and address registers 444. The address registers 444 may include a plurality of registers 445, each of which may be configured to store an address, for example, a row address. The address registers 444 may include any number of registers 445 (e.g., 32).

The address history control circuit 442 may be configured to receive a row address. RA in response to an activate command ACTV and provide the control signal MAT1 indicating whether the row address RA matches any row addresses stored in the registers 445 of the address registers 444. As described, the control signal MAT1 may be provided to the address filter 110 and the address tracking circuit 120.

The address history control circuit 442 may further be configured to receive each row address REFADDR and track the sequence in which each row address REFADDR is stored in the address registers 444. In response to an ERASE control signal, the address history control circuit 442 may determine whether the number of row addresses stored in the address registers 444 exceeds a threshold. If the number of row addresses does not exceed the threshold, the address history control circuit 442 may erase the oldest row address stored in the address registers 444. If the number of row addresses exceeds the threshold, the address history control circuit 442 may iteratively erase the oldest row address stored in the address registers 444 until the number of row addresses no longer exceeds the threshold. By way of example, if the threshold number of addresses is 7 and 9 row addresses are stored in the address registers 444, in response to an ERASE control signal, the address history control circuit 442 may erase the 3 oldest row addresses.

As described, the address filter 110 may assert the COMPARE control signal during a particular refresh operation of a refresh interval. In some instances, however, it may be desirable to randomize the refresh operation in which the COMPARE, control signal is asserted.

Figure 5:
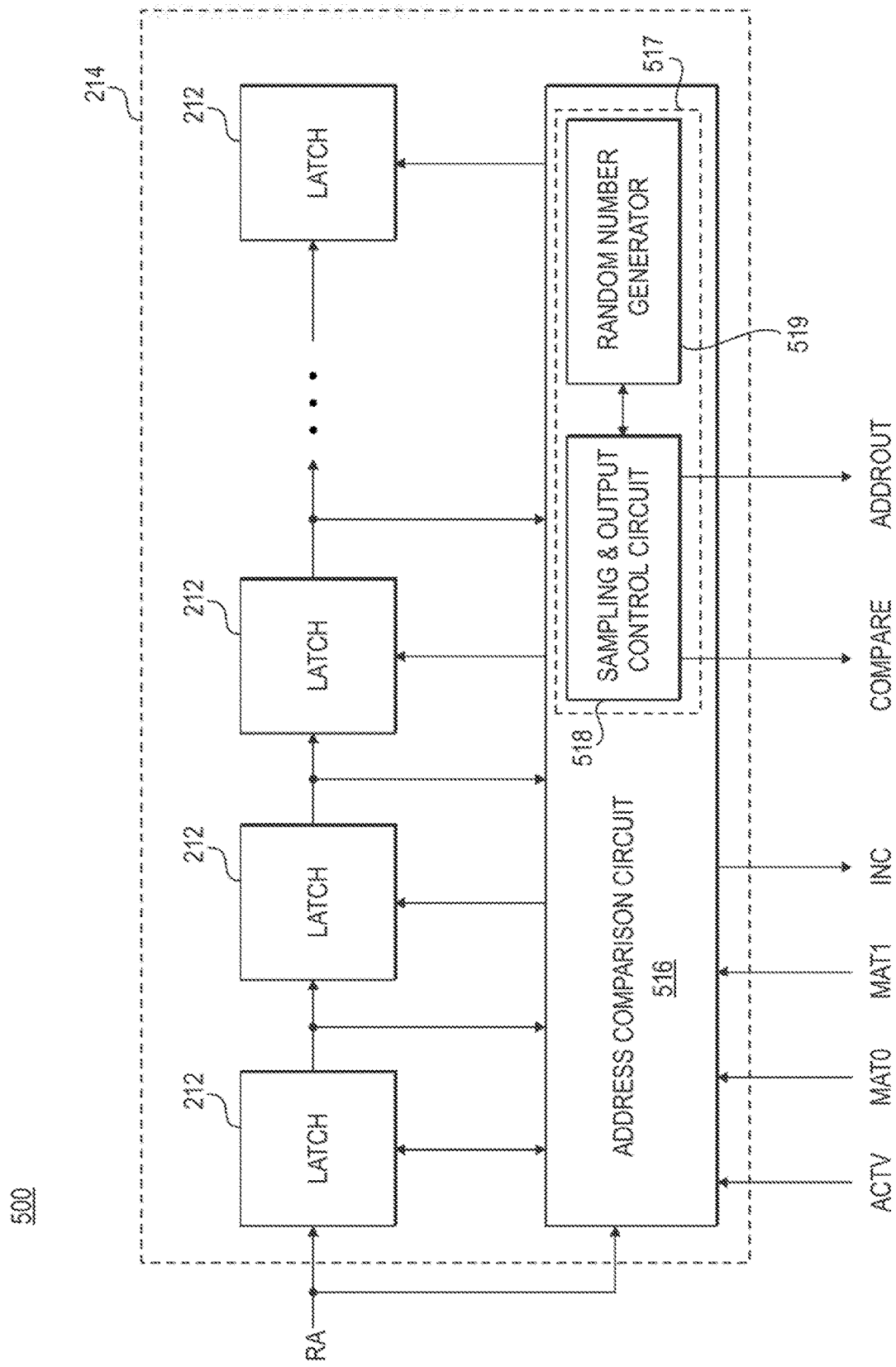
FIG. 5 is a block diagram of an address filter according to an embodiment of the present invention.

FIG. 5 is a block diagram of an address filter 500 according to an embodiment of the present invention. The address filter 500 may be used to implement the address filter 110 of FIG. 1 and may include elements that have been previously described with respect to the address filter 200 of FIG. 2. Those elements have been identified in FIG. 5 using the same reference numbers used in FIG. 1 and operation of the common elements is as previously described. Consequently, a detailed description of the operation of these particular elements will not be repeated in the interest of brevity.

The address filter 500 may include an address comparison circuit 516 that in turn may include a random sampling circuit 517. Briefly, the random sampling circuit 517 may be configured to assert the COMPARE control signal responsive to a random e.g., pseudorandom) number of refresh operations.

As illustrated, the random sampling circuit 517 may include a sampling and output control circuit 518 and a random number generator 519. The sampling and output control circuit 518 may be coupled to the random number generator 519 and configured to cause the random number generator 519 to provide a random number. In some examples, the random number may be within a range of 1-255. The sampling and output control circuit 518 may receive the random number identifying a refresh operation. During the identified refresh operation, the sampling and output control circuit 518 may assert the COMPARE control signal. The ADDROUT control signal may be subsequently be asserted during a different refresh operation, such as the last refresh operation of the refresh interval.

Thus, the sampling and output control circuit 518 may randomly assert the COMPARE control signal and periodically provide the ADDROUT control signal during each refresh interval. In other examples, the ADDROUT control signal may also be asserted during a random refresh operation. The COMPARE and ADDROUT control signals may be asserted based on a same random number or may be provided based on different random numbers.

The random number generator 519 may comprise a linear feedback shift register and accordingly, may receive a starting seed from the sampling and output control circuit 518 from which to begin counting. In at least one embodiment, the seed may be based on a row address RA. Once the count of the random number generator 519 is determined to match the seed, it is known that the random number generator 519 has cycled through each possible state, and the random number generator 519 may receive a new seed from which to start counting.

Figure 6:
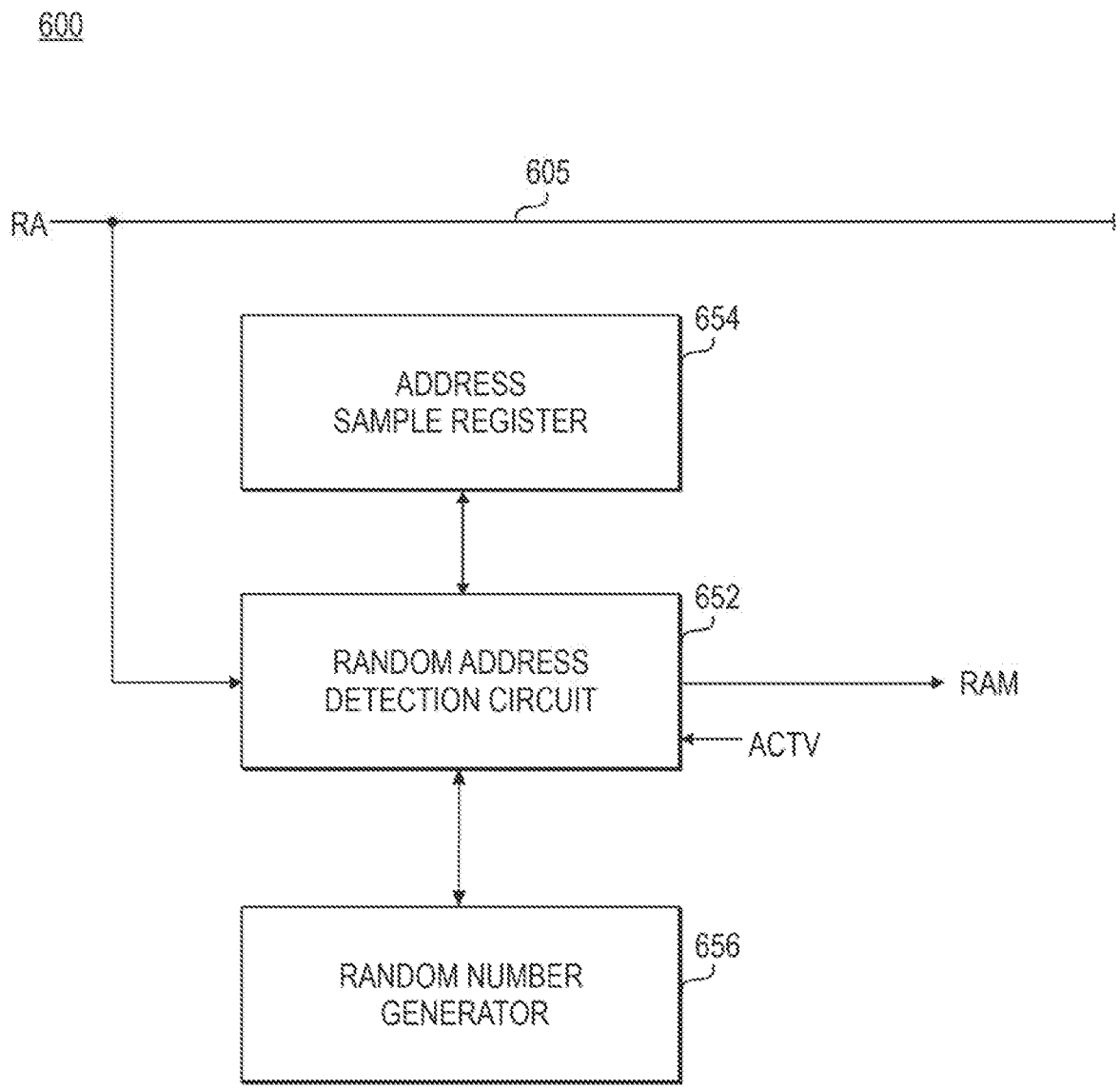
FIG. 6 is a block diagram of an apparatus according to an embodiment of the present invention.

FIG. 6 is a block diagram of an address detection circuit 600 according to an embodiment of the present invention. The address detection circuit 600 may include a random address detection circuit 652, an address sample register 654, and a random number generator 656. The random number generator 656 may be implemented using the random number generator 519 of FIG. 5.

The random address detection circuit 652 may be coupled to the random number generator 656 and configured to receive a random number therefrom. The random address detection circuit 652 may further be coupled to the row address bus 605 and configured to selectively receive a row address RA based on the random number. The random address detection circuit 652 may be coupled to the address sample register 654 and configured to store each received row address RA therein. Each row address stored in the address sample register 654 may be selected by the random address detection circuit 652 based on the random number and provided as the row address REFADDR.

For example, the random address detection circuit 652 may determine a frequency at which to receive row addresses RA from the row address bus 605 based on the random number. The random address detection circuit 652 may, for instance, use the random number to determine a number of activate commands ACTV. Responsive to the receipt of the determined number of activate commands ACTV, the random address detection circuit may receive a row address RA from the row address bus 605 and store the row address RA in the address sample register 654. In some embodiments, the address sample register 654 may be configured to store only a single row address, and thus, storing a row address in this manner may overwrite any previously stored address. The random access detection circuit 652 may further use the random number to determine a refresh operation during which to select (e.g., sample) the row address stored in the address sample register 654.

During a same or subsequent refresh operation, the selected address may be provided as the row address REFADDR. In some examples, the selected address may be provided during the last refresh operation of a refresh interval. For each refresh interval, the random number may vary. As a result, both the frequency at which row addresses RA are received and the time at which the row address in the address sample register 654 is selected may vary. As previously described, the time at which the selected row address is provided may be periodic (e.g., provided during a same refresh operation of each refresh interval). In other examples, the time at which the selected row address is provided may be also vary randomly.

In an example operation of the address detection circuit 600, the random address detection circuit 652 may receive a random number from the random number generator 656. Based on the random number, the random address detection circuit 652 may determine a frequency for receiving row addresses RA from the row address bus 605. As described, the frequency may indicate a number of received activate commands ACTV. Based on the random number, the random address detection circuit 652 may further identify a refresh operation of a refresh interval for selecting the address stored in the sample address register 654.

The random address detection circuit 452 may receive row addresses RA at the determined frequency and store each received row address RA in the sample address register 654. Once refresh operation is performed, the random address detection circuit 652 may select the address stored in the sample address register 654. During the last refresh operation of the refresh interval, the random address detection circuit 652 may provide the sampled address as the row address REFADDR.

Figure 7:
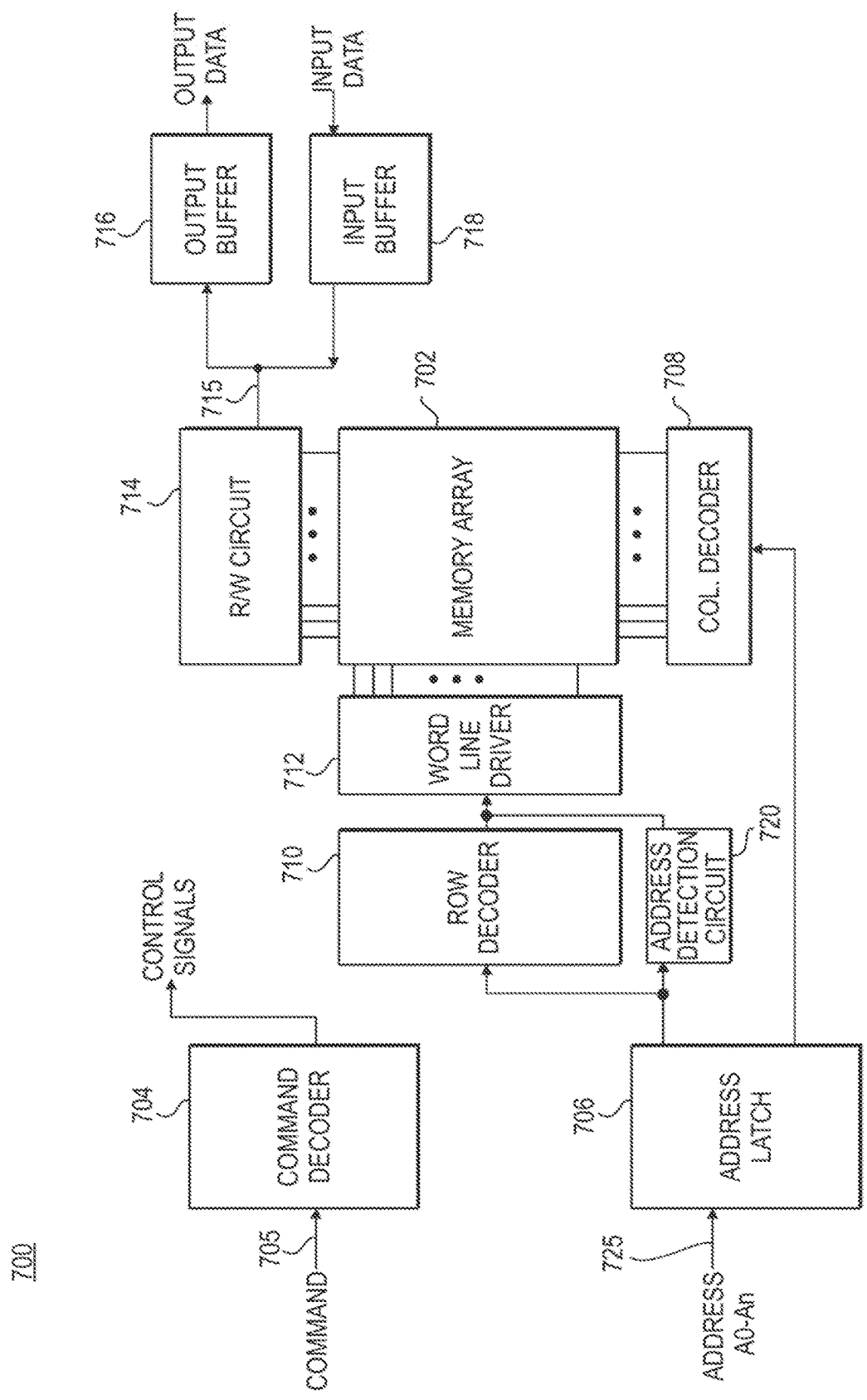
FIG. 7 is a block diagram of a memory according to an embodiment of the present invention.

FIG. 7 is a part of a memory 700 that may include the address detection circuit 100 of FIG. 1 or the address detection circuit 600 of FIG. 6 according to an embodiment of the invention. The memory 700 includes an array 702 of memory cells, which may be, for example, volatile memory cells (e.g., DRAM memory cells, SRAM memory cells), non-volatile memory cells (e.g., flash memory cells), or some other types of memory cells, and may include any number of banks and/or sections of memory as described herein. The memory 700 includes an address/command decoder 704 that receives memory commands (e.g., refresh commands) and addresses through an ADDR/CMD bus. The address/command decoder 704 generates control signals, based on the commands received through the ADDR/CMD bus. The address/command decoder 704 also provides row and column addresses to the memory 700 through an address bus and an address latch 706. The address latch then outputs separate column addresses and separate row addresses.

The row and column addresses are provided, by the address latch 706 to, a row address decoder 710 and a column address decoder 708, respectively. The column address decoder 708 selects lines extending through the array 702 corresponding to respective column addresses. The row address decoder 710 is connected to word line driver 712 that activates respective rows of memory cells in the array 702 corresponding to received row addresses. The selected line (e.g., a bit line or bit lines) corresponding to a received column address are coupled to a read/write circuitry 714 to provide read data to a data output circuit 716 via an input-output data bus 715. Write data are provided to the memory array 702 through a data input circuit 718 and the memory array read/write circuitry 714.

The memory 700 may include an address detection circuit 720 according to an embodiment of the invention, for example, an address detection circuit which may be similar to the address detection circuit 100 of FIG. 1 or the address detection circuit 600 of FIG. 6 described herein. The address detection circuit 720 may be configured to receive a row address and provide a row address to the word line driver 712, that has been detected by the address detection circuit 720. In some embodiments, the address detection circuit 720 may additionally or alternatively provide one or more row addresses associated with rows adjacent the row associated with the detected row address. In other embodiments, the word line driver 712 may identify one or more row addresses associated with rows adjacent the row associated with the detected row address in response to receiving the detected row address from the address detection circuit 720. In some embodiments, the address detection circuit may be included in another circuit, for example, the address detection circuit may be included in the row decoder 710 and/or the command decoder 704, or in any other location in the memory 700. The address detection circuit 720 may provide for detection of addresses, such as addresses accessed a relatively high number of times.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus comprising:
  a detection circuit configured to determine a frequency; and
  a register configured to store a stored row address, receive a new address from a row address bus at a rate based on the frequency, and replace the stored row address with the new address, wherein a refresh address based on the stored address is provided as part of a refresh interval and wherein one or more rows of a memory based on the refresh address are refreshed.

2. The apparatus of claim 1, further comprising a random number generator configured to provide a random number, and wherein the detection circuit is configured to determine the frequency based on the random number.

3. The apparatus of claim 2, wherein the random number generator is configured to provide a new random number in each refresh intervals.

4. The apparatus of claim 2, wherein the detection circuit is further configured to use the random number to determine when to refresh the one or more rows of memory in the refresh interval.

5. The apparatus of claim 2, wherein the random number is based on another address.

6. The apparatus of claim 1, wherein the rate at which the register receives new addresses changes responsive to the refresh interval.

7. The apparatus of claim 1, wherein the register receives the new row address based on a plurality of activate commands and the frequency.

8. The apparatus of claim 7, wherein the register is configured to receive the new address on one of the plurality of activate commands selected based on the frequency.

9. An apparatus, comprising:
a random number generator configured to provide a random number;
a random address detection circuit coupled to the random number generator and configured to receive the random number from the random number generator and receive a plurality of addresses from a row address bus, the random address detection circuit further configured to select an address of the plurality of addresses responsive to a first number of refresh operations and to provide the address responsive to a second number of refresh operations,
wherein the first number of refresh operations is based on the random number.

10. The apparatus of claim 9, wherein the random number generator comprises a linear feedback shift register.

11. The apparatus of claim 9, wherein the random address detection circuit is further configured to store the address in an address sample register.

12. The apparatus of claim 11, wherein the address sample register is configured to replace a currently stored row address with the new row address.

13. The apparatus of claim 9, wherein the random access detection circuit is further configured to receive each of the plurality of row addresses responsive to a number of activate commands, the number of activate commands based on the random number.

14. The apparatus of claim 9, wherein the random number is based on another address.

15. The apparatus of claim 9, wherein the apparatus is included in a memory.

16. A method comprising:
generating a frequency at which to receive new row addresses received from a row address bus;
storing the new row address in a register at the frequency;
providing a refresh address as part of a refresh operation, wherein the refresh address is based on a current row address stored in the register; and
refreshing rows of a memory based on the refresh address.

17. The method of claim 16, further comprising generating a random number with a random number generator, wherein the frequency is generated based on the random number.

18. The method of claim 17, wherein timing of refreshing the rows of the memory is based on the random number.

19. The method of claim 16, further comprising changing when the new row addresses are stored responsive to refreshing the rows of the memory.

20. The method of claim 16, further comprising receiving a plurality of activate commands and storing the new row address on a selected one of the plurality of activate commands based on the frequency.

* * * * *